(12) United States Patent
Lee et al.

(10) Patent No.: US 12,253,891 B2
(45) Date of Patent: Mar. 18, 2025

(54) TEMPERATURE CONTROL SYSTEM AND TEMPERATURE CONTROL METHOD FOR AIR CIRCULATION

(71) Applicants: Inventec (Pudong) Technology Corporation, Shanghai (CN); INVENTEC CORPORATION, Taipei (TW)

(72) Inventors: Chien-Ming Lee, Taipei (TW); Kai-Yang Tung, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 437 days.

(21) Appl. No.: 17/664,222

(22) Filed: May 19, 2022

(65) Prior Publication Data

US 2023/0146750 A1 May 11, 2023

(30) Foreign Application Priority Data

Nov. 11, 2021 (CN) .......................... 202111331801.2

(51) Int. Cl.
*G06F 1/20* (2006.01)
*G05D 23/19* (2006.01)

(52) U.S. Cl.
CPC ........... *G06F 1/20* (2013.01); *G05D 23/1932* (2013.01); *G05B 2219/49216* (2013.01)

(58) Field of Classification Search
CPC ...... G05B 19/4155; G05B 2219/49216; G05D 23/1917; G05D 23/1932; G05D 23/1934; G06F 1/20; G06F 1/206; H05K 7/20736; H05K 7/20836; Y02D 10/00
USPC ........................................................ 700/300
See application file for complete search history.

(56) References Cited

U.S. PATENT DOCUMENTS

| | | | |
|---|---|---|---|
| 8,526,182 B2 * | 9/2013 | Chen .................. | H05K 7/20736 361/679.48 |
| 2020/0379529 A1 * | 12/2020 | Le Goff .................. | G06F 1/206 |
| 2021/0294399 A1 * | 9/2021 | Belvant More ..... | G05B 13/0265 |
| 2022/0018567 A1 * | 1/2022 | Ock ........................ | G05B 15/02 |

* cited by examiner

*Primary Examiner* — Chun Cao
(74) *Attorney, Agent, or Firm* — CKC & Partners Co., LLC

(57) ABSTRACT

An temperature control method including the following steps: driving an temperature control device to generate air circulation for a first server and a second server; monitoring operation state of the temperature control device, the first server and the second server continuously to establish a first learning model; receiving an temperature control state data of the temperature control device, a first state data of the first server, and a second state data of the second server, wherein the first state data includes a first temperature, and the second state data includes a second temperature; inputting the temperature control state data, the first state data, and the second state data into the first learning model to obtain a first temperature prediction value output by the first learning model; and adjusting the temperature control device according to the first temperature prediction value.

13 Claims, 4 Drawing Sheets

TEMPERATURE CONTROL SYSTEM AND TEMPERATURE CONTROL METHOD FOR AIR CIRCULATION

CROSS-REFERENCE TO RELATED APPLICATION

This application claims priority to China Application Serial Number 202111331801.2, filed Nov. 11, 2021, which is herein incorporated by reference in its entirety.

BACKGROUND

Technical Field

The present disclosure relates to a temperature control system and a temperature control method thereof, especially a technology for driving a temperature control device according to the temperature of a computer facility or a rack.

Description of Related Art

With the development of Internet of things (IOT), artificial intelligence and network technology, the construction of "computer facility" (i.e., data centers) has been paid more and more attention. Computer facility refer to the space where a large number of servers are systematically set up through racks (cabinets) to manage and protect data. At present, the industry has established standardized guidelines for the specific technical requirements of computer facilities.

Rack Cooling Index (RCI) refers to a intake temperature of each rack. For example, the intake temperature of the rack should not exceed the range of 18~27° C. When the intake temperature is lower than 18° C., it means that the temperature control system of the computer facility is in a state of excessive energy consumption. On the other hand, if the intake temperature is higher than 27° C., it means that the cooling efficiency of the temperature control equipment is not ideal. When the intake air temperature of the rack is too high, the temperature control device is activated, and the uncertainty of the time delay may cause the temperature control device to be unresponsive. Furthermore, due to the height effect of the rack and the change of the server load, the intake air temperature and the rack height has a variable gradient change, which also increases the difficulty of controlling the intake air temperature.

The temperature control of the computer facility faces a dilemma. For the design of the computer facility, temperature control device is often over-engineered to ensure that the computer facility is maintained at a low temperature and can dissipate heat immediately, but this also keeps operating costs high and resulted in excessive cooling costs. Therefore, how to take into account the energy consumption and efficiency of the temperature control system while ensuring the normal operation of the servers will be a major issue at present.

SUMMARY

One aspect of the present disclosure is a temperature control method, comprising: driving an temperature control device to generate air circulation for a first server and a second server; detecting a plurality of operation states of the temperature control device, the first server and the second server continuously to establish a first learning model, wherein the first learning model is configured to predict a temperature change of the first server; receiving an temperature control state data of the temperature control device, a first state data of the first server, and a second state data of the second server, wherein the first state data includes a first temperature of the first server, and the second state data includes a second temperature of the second server; inputting the temperature control state data, the first state data, and the second state data into the first learning model to obtain a first temperature prediction value output by the first learning model; and adjusting the temperature control device according to the first temperature prediction value.

Another aspect of the present disclosure is a temperature control system, comprising a temperature control device, a first sensor, a second sensor and an analysis device. The temperature control device is configured to generate an air circulation for a first server and a second server. The first sensor is configured to detect an operation state of the first server, and configured to obtain a first state data. The second sensor is configured to detect an operation state of the second server, and is configured to obtain a second state data. The analysis device is coupled to the temperature control device, the first sensor and the second sensor, is configured to detect an operation state of the temperature control device, and configured to obtain the operation states of the first server and the second server continuously to establish a first learning model. The analysis device is further configured to input a temperature control state data of the temperature control device, a first temperature of the first state data and a second temperature of the second state data into the first learning model to obtain a first temperature prediction value output by the first learning model. The analysis device is further configured to adjust the temperature control device according to the first temperature prediction value.

Accordingly, the temperature control system establishes a learning model according to each server, so as to reduce the computational complexity of training the model and predicting the temperature, and further to predict the change of an intake air temperature gradient distribution of the rack after several time units according to each learning model established corresponding to each server. Therefore, the temperature control system adjusts the temperature control device in advance when determining that a future temperature will exceed a preset range to ensure the operating efficiency of the server and the energy consumption of the temperature control device to optimize energy efficiency.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1A:
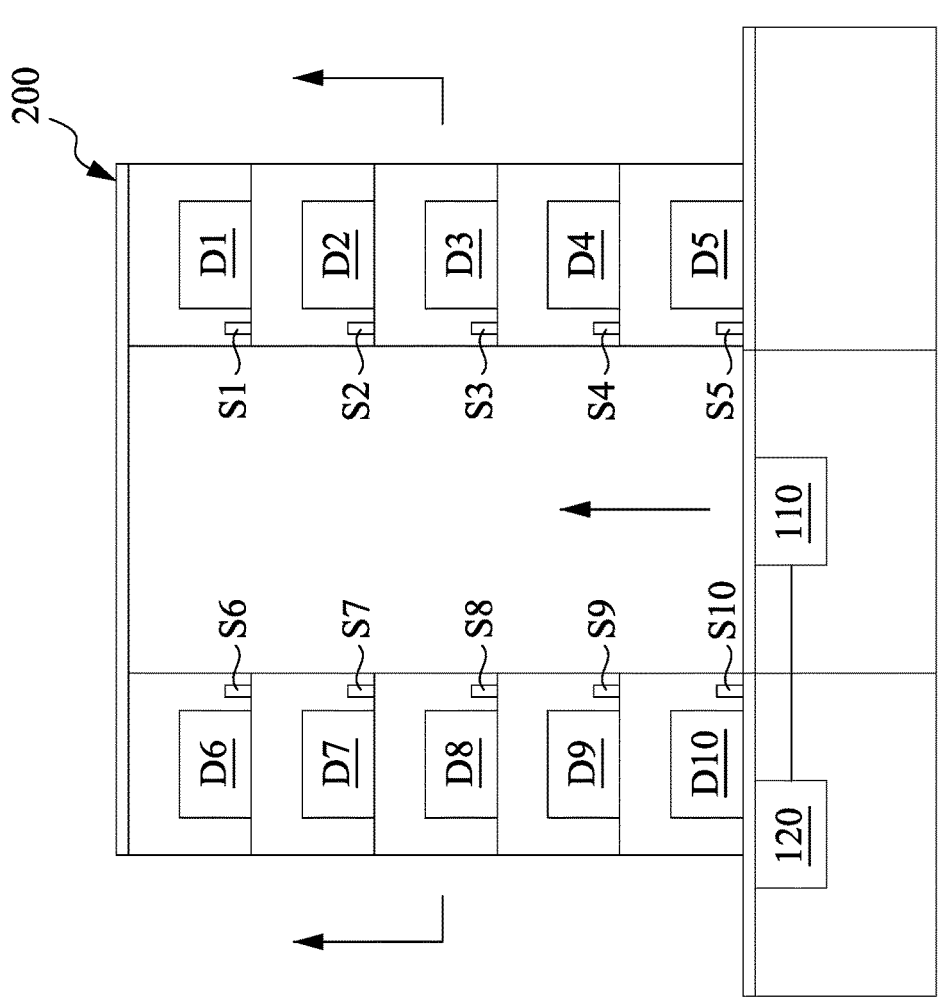
FIG. 1A is a schematic diagram of a temperature control system in some embodiments of the present disclosure.
Figure 1B:
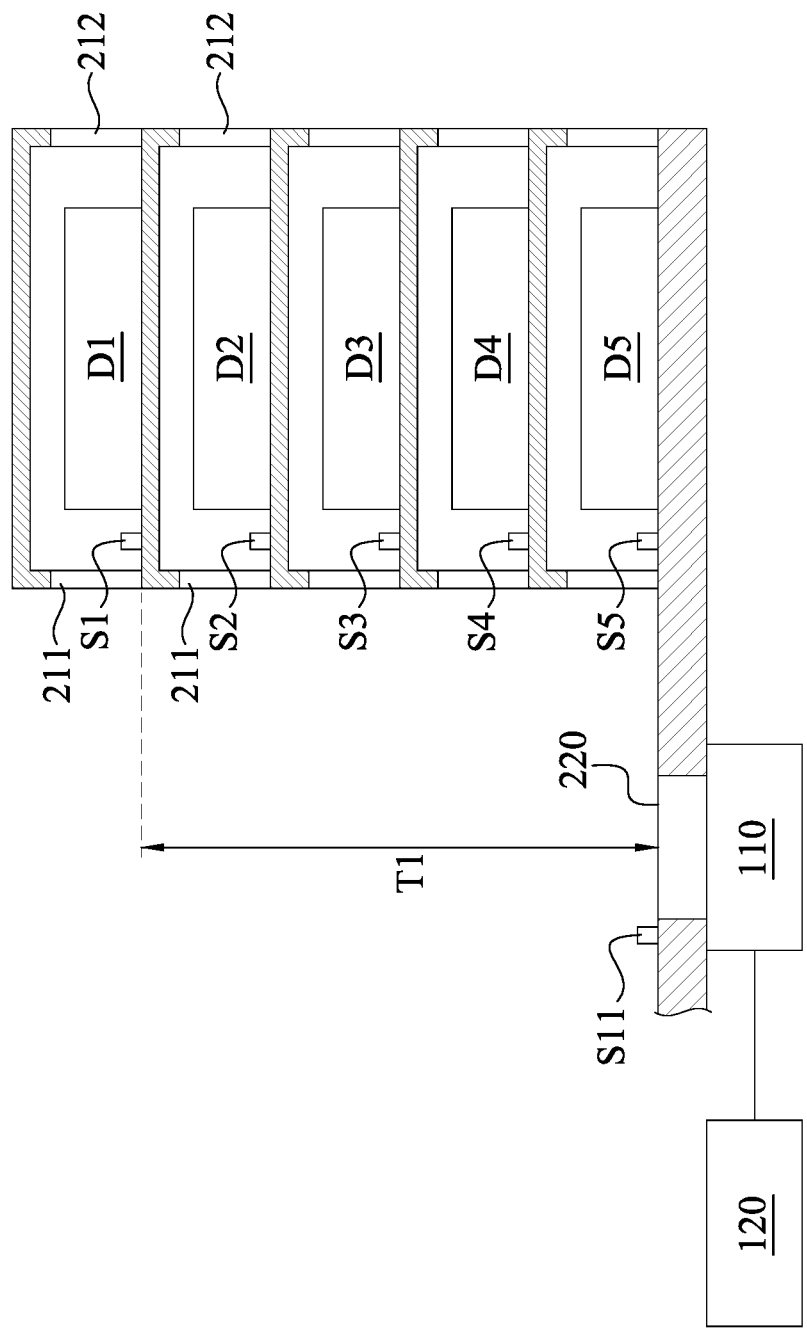
FIG. 1B is a schematic diagram of a temperature control system in some embodiments of the present disclosure.

The present disclosure relates to a temperature control system 100 and a temperature control method. FIG. 1A and FIG. 1B are schematic diagrams of a temperature control system 100 in some embodiments of the present disclosure. In this embodiment, the temperature control system 100 is applied to the computer facility of the data center (as shown in FIG. 1A), the computer facility includes multiple racks 200. Each of racks 200 has multiple placement spaces for setting up multiple servers D1-D10. Each server D1-D10 includes a heater, a fan and a cooling module of fan, and a wireless module, and can control the fan speed, control the power of the heater, and obtain/capture the internal temperature of the servers. Since person having ordinary skill in the art can understand the structure of the rack 200 and the way in which servers D1-D10 are installed in the rack, they will not be described here.

The temperature control system 100 includes a temperature control device 110, a plurality of sensors S1-S10 and an analysis device 120. In some embodiments, the temperature control device 110 includes a blower that drives a fan by a motor to generate cool air in the direction of the rack 200. Cold air will form an air circulation between multiple racks 200 to control the temperatures of racks 200 and servers D1-D10. In one embodiment, the temperature control system 100 further includes a ventilation device (not shown in figure), and the ventilation device is disposed above the rack 200 to assist in forming an air circulation. In other embodiments, the temperature control device 110 can also generate hot air, and the air circulation is not limited to cold air.

In some embodiments, the rack 200 has a cold chamber to guide cold air and hot air to avoid mixing the cold and hot air with each other. As shown in the computer facility in FIG. 1A, there are cold air passages between multiple racks 200 (e.g., arrow in the middle of FIG. 1A), the temperature control device 110 is configured to generate a cold air for a cold air channel near the rack 200 or between multiple racks 200. After passing through the servers D1-D10, the cold air will flow out from the hot air channel (e.g., the arrows on both sides of FIG. 1A) behind the rack 200. In addition, the blower of the temperature control device 110 can be arranged under the raised floor of the computer facility (i.e., corresponding to the position of the cold air passage) to ensure the flow of the airflow.

In one embodiment, sensors S1-S10 are respectively arranged in the rack 200 adjacent to each of the servers D1-D10 for detecting the operation state of the servers D1-D10. As shown in FIG. 1B, the rack 200 is provided with intakes 211 and outtakes 212 at positions corresponding to each of the placement spaces. In some embodiments, sensors S1-S10 (e.g., thermocouples) are arranged at positions corresponding to the intakes 211 to detect the temperatures of the cool air flowing to servers D1-D10. In other embodiments, the sensors S1-S10 may be arranged at positions corresponding to the outtakes 212, or sensors can be arranged in the rack 200 for the intakes 211 and the outtakes 212 of each server D1-D10 to detect the cold air temperatures after passing through the servers D1-D10. In some other embodiments, the sensors S1-S10 may also be electrically coupled to the servers D1-D10 to detect the load power of the servers D1-D10 and transmit the detected data to the analysis device 120.

The analysis device 120 is electrically coupled to the temperature control device 110 and the sensors S1-S10, so as to continuously detect or obtain the operation states of the temperature control device 110 and the servers D1-D10. The analysis device 120 is configured to establish a corresponding learning model for each server according to the detected operation states of the temperature control device 110 and servers D1-D10, so as to predict the temperature change of each server in a future period of time.

By the learning model established in advance, the temperature control system 100 can predict the temperature change after a period of time in the future by detecting current state of the servers D1-D10. For example, after establishing "the first learning model" for predicting the the future temperature of the first server D1, the first learning model can predict a first temperature prediction value according to the temperature control device 110 and the state data of the first server D1 and the second server D2, and adjusts the temperature control device 110 accordingly.

The following takes the first sensor S1 and the second sensor S2 as examples to illustrate how the temperature control system 100 establishes the learning model. Since the operation of the other sensors S3-S10 is similar to that of the sensors S1 and S2, it will not be repeated here. The first sensor S1 and the second sensor S2 are configured to detect the operation states of the first server D1 and the second server D2. In some embodiments, "the operation state" includes a current temperature of the first server D1 and a current temperature of the second server D2. In addition, when establishing "the first learning model" for predicting the future temperature of the first server D1, "the operation state" includes the current load power of the first server D1, the fan speed of the cooling fans in the first server D1 or the change trend of the fan speed.

The above operation state configured to establish the learning model includes (but is not limited to) the following data: the cold air temperature and the cold air flow rate of the temperature control device 110, the temperature of the intakes 211 or the outtakes 212 of the rack 200, the load power of servers D1-D11, the fan speed and key components (e.g., CPU) temperature, the setting positions of servers D1-D11 (e.g., the rack height), etc.

In one embodiment, the analysis device 120 uses the deep learning model to train with a large amount of historical data to establish the learning model. Take the first learning model of "predicting the temperature of the first server D1 (e.g., the temperature at the intake 211)" as an example, the analysis device 120 sets the operation states (e.g., the current temperature) of the temperature control device 110, the first server D1 and the second server D2 as input features, sets the temperature of the first server D1 after a period of time (e.g., three minutes later) as the output target, and performs training in a deep learning manner. After a large amount of training, the mapping function between the input features and the output target can be established, that is, the first learning model.

In some embodiments, the deep learning model used by the analysis device 120 is Gated Recurrent Unit (GRU). GRU is a type of Recurrent Neural Network (RNN), which is especially used to deal with data problems with time series. Through the appropriate deep learning model, the mapping function of the model can be updated periodically with new data.

The change of the overall intake air temperature of the rack 200 is affected by many physical variables, such as the fan speed of each server D1-D10, the intake temperatures, the outtake temperatures and the power load of servers D1-D20 itself. If the analysis device 120 is to directly use "the overall temperature of the rack 200" as the output target to establish the learning model, all servers D1-D10 variables must be set as input features. As a result, the computational load of the analysis device 120 will be too large, making it difficult to accurately and quickly complete the prediction. Therefore, the present disclosure sets the target of the learning model as "the temperature of each server", by predicting the future temperature of each server separately, and then calculates the overall temperature of the rack 200 according to multiple prediction results. This "distributed" learning model can take into account the operating efficiency and prediction accuracy of the analysis device 120, so that when the temperature control system 100 determines that the future temperature of the rack 200 will exceed an expected range, the temperature control system 100 can instantly adjust the temperature control device 110.

When establishing the learning model, the temperature control system 100 of the present disclosure not only detects the operation state of the target server, but also obtains the operation state of the adjacent target server according to the thermal interaction of the adjacent server, so as to improve analysis accuracy. For example, when establishing the first learning model for the first server D1, in addition to obtaining the temperature and load power of the first server D1, the temperature of the second server D2 (adjacent to the first server D1) is also obtained at the same time. In some embodiments, since the "temperature" of the second server D2 will affect the temperature of the first server D1, but the load power of the second server D2 will not affect the temperature of the first server D1, the analysis device 120 only applies the temperature of the second server D2 to train the first learning model.

After the learning model is established, the temperature control system 100 can continuously monitor the temperature control device 110 and the state data of each server D1-D10, and inputs the state data to the learning model to predict the future temperature of each server. It should be mentioned that the "the operation state" configured to establish/train the learning model by the temperature control system 100 can be the same type of the "state data" obtained by the temperature control system continuously detecting the temperature control device 110 and each server D1-D10. The difference between the two is: "the operation state" is configured to train the learning model, and "state data" is input to the learning model as input features to predict the temperature in the subsequent period of time.

The present disclosure can predict the temperature of servers D1-D10 (e.g., the temperature inside the servers or at the intake 211) through the learning model. When it is predicted that the temperature of the servers D1-D10 may be too high, the fan of the temperature control device 110 can be controlled in advance to increase the air circulation, so as to implement a state predictor of the temperature control system 100. According to the future temperature change predicted by the learning model, the temperature control system 100 can be dynamically controlled according to the future "trend" of the temperature change. In addition, the temperature control system 100 of the present disclosure can also be applied to the problem of changing cooling modes configured by the computer facility in different data centers.

Figure 2:
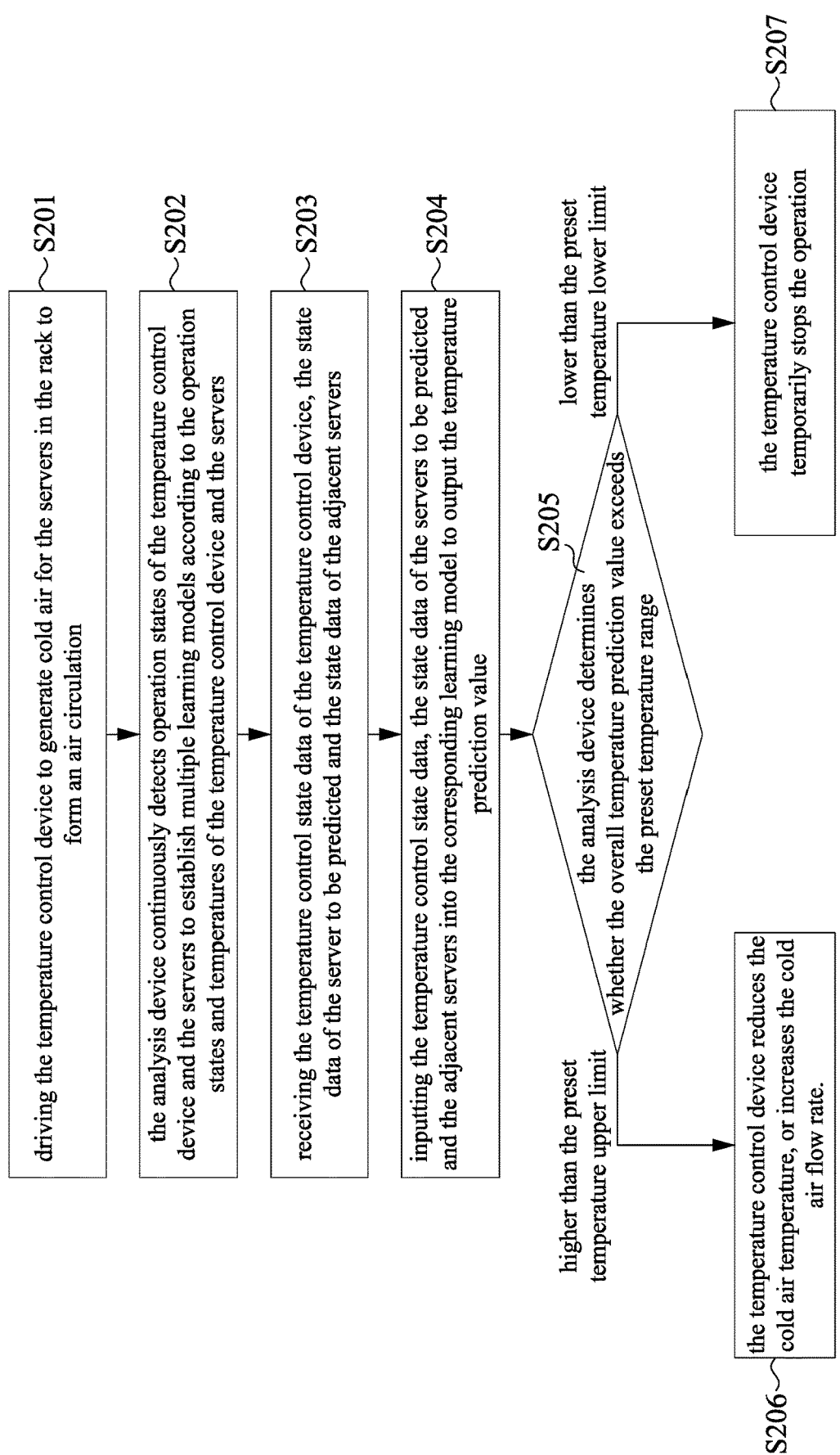
FIG. 2 is a flowchart illustrating a temperature control method in some embodiments of the present disclosure.

FIG. 2 is a flowchart illustrating a temperature control method in some embodiments of the present disclosure. The operation of the present disclosure is described below according to FIGS. 1A-2. In step S201, the temperature control device 110 is driven to generate cold air for the servers D1-D10 in the rack 200 to form an air circulation.

In step S202, the analysis device 120 continuously detects operation states of the temperature control device 110 and the servers D1-D10 to establish multiple learning models according to the operation states and temperatures of the temperature control device 110 and the servers D1-D10. The learning models are configured to predict temperature change of the corresponding server in the future (e.g., 1-3 minutes in the future) or after a period of time (after 1 minute).

Specifically, taking the first learning model as an example, during a detection period (e.g., every three minutes), the analysis device 120 receives data from the temperature control device 110, the first sensor S1 and the second sensor S2, respectively. This data includes information set to be generated by the temperature control device 110, including the cold air temperature or the cold air flow rate, the operating temperature (e.g., the intake temperature or the outtake temperature) and the load power of the first server D1, and including the current operating temperature of the second server D2 (e.g., the intake temperature). The above operating temperatures mean temperatures at which the first server and the second server operate. The analysis device 120 continuously receives operational data to train the first learning model. For example, taking "the current operating data of the temperature control device 110, the first sensor S1 and the second sensor S2" as the input feature for training, and using "actual temperature after one minute" of the first sensor S1 as the confirmed output target, so that the first learning model can establish the parameter or weight value corresponding to each input feature after multiple trainings.

Similarly, the analysis device 120 will continuously detect the operation state of the temperature control device, the second server D2 and the first server D1 in a detection period to establish a second learning model. In some other embodiments, since both the first server D1 and the third server D3 are adjacent to the second server D2 (i.e., above and below the same rack), the analysis device 120 is also configured to establish/train the second learning model according to the current temperature of the third server D3.

In step S203, after the learning models are established, the temperature control system 100 can predict whether the future temperature of the rack 200 or servers D1-D10 will exceed the preset range. Specifically, the analysis device 120 continuously or regularly receives the temperature control state data of the temperature control device 110, the state data of the server to be predicted (e.g., the first state data of the first server D1) and the state data of the adjacent servers (e.g., the second state data of the second server D2).

The temperature control state data includes a cold air temperature or a cold air flow rate of the temperature control device 110. In some embodiments, the cold air temperature or the cold air flow rate may be a set value of the temperature control device 110, the analysis device 120 is electrically coupled to the temperature control device 110, and is configured to receive or adjust the cold air temperature or the cold air flow rate of the temperature control device 110. In some other embodiments, a sensor is arranged in the computer facility corresponding to the intake 220 of the temperature control device 110 to detect the cold air temperature or the cold air flow rate of the temperature control device 110.

As mentioned above, the state data for servers can be the current temperature of the servers. The analysis device 120 can obtain the current temperature of each server D1-D10 by multiple sensors S1-S10, respectively. In addition, the state data for servers includes load power, current temperature and/or fan speed. In the embodiment shown in FIG. 1B, the sensors are arranged in the rack 200 adjacent to the servers, but in other embodiments, the sensors can also be arranged inside the corresponding servers.

Furthermore, the state data of each servers also includes a distance between the server and the temperature control device. For example, the first state data of the first server D1 includes a first distance T1 between the first server D1 and the temperature control device 110. Similarly, if the temperature of the second server D2 is predicted through the second learning model, the second state data obtained by the analysis device 120 includes a second distance between the second server D2 and the temperature control device 110.

In step S204, the analysis device 120 inputs the temperature control state data, the state data of the servers to be predicted and the adjacent servers into the corresponding learning model as input features. The learning model will operate on these input features according to the established parameters or weights to output the temperature prediction value. For example, the analysis device 120 inputs the temperature control state data, the first state data of the first server D1 and the second state data of the second server D2 into the first learning model to obtain the first temperature prediction value (e.g., the predicted temperature for 1 minute).

Similarly, the analysis device 120 inputs the temperature control state data, the first state data of the first server D1 and the second state data of the second server D2 into the second learning model to obtain a second temperature prediction value. In other embodiments, since both the first server D1 and the third server D3 are adjacent to the second server D2, the analysis device 120 is also configured to input the current temperature of the third server D3 as the third state data to the second learning model to obtain the second temperature prediction value.

After the analysis device 120 obtains the corresponding temperature prediction value from each of the learning models, the analysis device 120 calculates an overall temperature prediction value of the rack 200 according to the temperature prediction values. For example, the analysis device 120 calculates or predicts the overall temperature prediction value of the rack 200 according to the first temperature prediction value and the second temperature prediction value. The analysis device 120 can calculate the overall temperature distribution of the rack 200 according to the interpolation method, or taking the obtained highest/lowest one of temperature prediction values as the overall temperature prediction value.

In step S205, after obtaining the overall temperature prediction value, the analysis device 120 will determine whether the overall temperature prediction value exceeds the preset temperature range, so as to adjust the temperature control device 110 accordingly. If the overall temperature prediction value is higher than the preset temperature upper limit, in step S206, the analysis device 120 controls the temperature control device 110 to reduce the cold air temperature, or increase the cold air flow rate. On the other hand, if the overall temperature prediction value is lower than the preset temperature lower limit, in step S207, the analysis device 120 will control the temperature control device 110 to stop operating the temperature control device 110 temporarily. Accordingly, the temperature of the rack 200 can be prevented from exceeding the preset temperature range.

Figure 3:
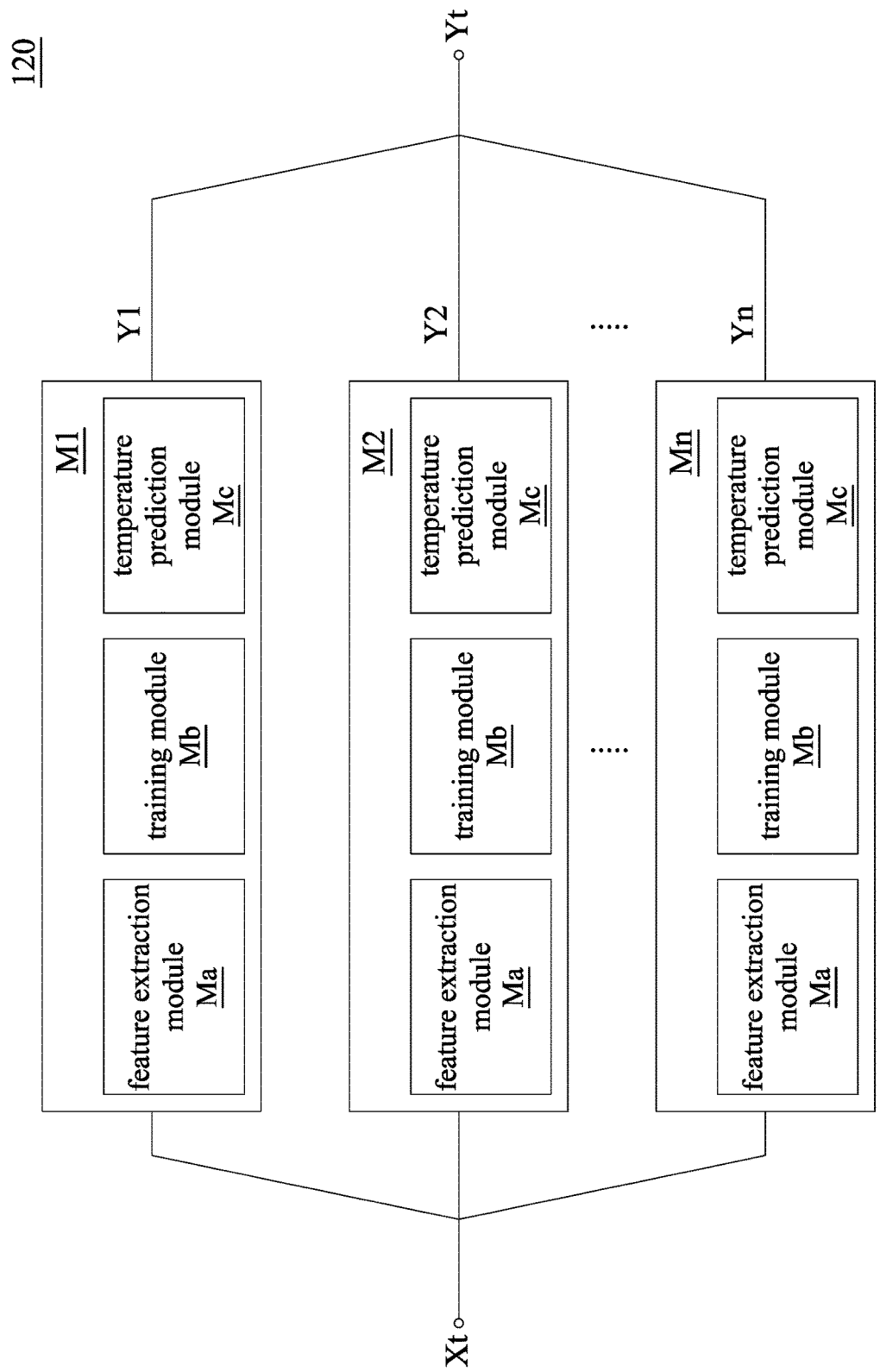
FIG. 3 is a schematic diagram of a distributed learning model in some embodiments of the present disclosure.

FIG. 3 is a schematic diagram of a distributed learning model in some embodiments of the present disclosure. As shown in the figure, the temperature control system 100 is established with multiple learning models M1-Mn, each learning model M1-Mn corresponds to a server, and includes a feature extraction module Ma, a training module Mb and a temperature prediction module Mc. The feature extraction module Ma is configured to obtain an input feature Xt from the temperature control device 110 and the sensors S1-S10, and extract the required data. For example, the first learning module M1 captures the temperature of the first server D1 and the second server D2 as input features.

If the input feature Xt corresponds to a known output target (i.e., the temperature after a period of time), the learning models M1-Mn adjust the training module Mb according to the input feature (i.e., the operation state). If the extracted input feature Xt does not correspond to an output target, the learning models M1-Mn input the input features (i.e., state data) to the temperature prediction module Mc to predict the temperature. As shown in the figure, the learning models M1-Mn outputs corresponding output targets Y1-Yn. The output targets Y1~Yn are the server temperatures predicted by the learning models M1~Mn. According to the output targets Y1-Yn, the analysis device 120 can accordingly calculate the overall temperature prediction value Yt of the rack 200.

In an embodiment of the present disclosure, the temperature control method can be applied to servers, and the servers can be used for artificial intelligence (AI) operation, edge computing, and can also be used as 5G servers, cloud servers, or the server of Vehicle-to-everything (V2X).

The elements, method steps, or technical features in the foregoing embodiments may be combined with each other, and are not limited to the order of the specification description or the order of the drawings in the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A temperature control method, comprising:
   driving an temperature control device to generate air circulation for a first server and a second server;
   detecting a plurality of operation states of the temperature control device, the first server and the second server continuously to establish a first learning model, wherein the first learning model is configured to predict a temperature change of the first server;
   receiving an temperature control state data of the temperature control device, a first state data of the first server, and a second state data of the second server, wherein the first state data includes a first temperature of the first server, and the second state data includes a second temperature of the second server;
   inputting the temperature control state data, the first state data, and the second state data into the first learning model to obtain a first temperature prediction value output by the first learning model; and adjusting the temperature control device according to the first temperature prediction value;

wherein the first server is adjacent to the second server, and the first state data further comprises a first distance between the first server and the temperature control device.

2. The temperature control method of claim 1, wherein detecting the plurality of operation states of the temperature control device, the first server and the second server continuously comprises:

in a detection period, obtaining a cold air temperature or a cold air flow rate of the temperature control device; and in the detection period, obtaining a plurality of operating temperatures at which the first server and the second server operate.

3. The temperature control method of claim 1, wherein driving the temperature control device comprises:

generating, by the temperature control device, a cold air for a cold air channel near a rack.

4. The temperature control method of claim 1, wherein receiving the temperature control state data of the temperature control device, the first state data of the first server, and the second state data of the second server comprises:

obtaining, by a first sensor, the first temperature of the first server; and obtaining, by a second sensor, the second temperature of the second server, wherein the first server and the second server are arranged in a rack, and a plurality of positions of the first sensor and the second sensor correspond to a plurality of outtakes of the rack.

5. The temperature control method of claim 1, further comprising:

detecting the plurality of operation states of the temperature control device, the first server and the second server continuously to establish a second learning model, wherein the second learning model is configured to predict a temperature change of the second server;

receiving the temperature control state data, the first state data and the second state data; and inputting the temperature control state data, the first state data and the second state data into the second learning model to obtain a second temperature prediction value output by the second learning model.

6. The temperature control method of claim 5, wherein the first server and the second server are arranged in a rack, and adjusting the temperature control device according to the first temperature prediction value comprises:

calculating an overall temperature prediction value of the rack according to the first temperature prediction value and the second temperature prediction value; and adjusting a cold air temperature or a cold air flow rate of the temperature control device according to the overall temperature prediction value.

7. The temperature control method of claim 6, further comprising:

when the overall temperature prediction value is higher than a preset temperature upper limit, reducing the cold air temperature or increasing the cold air flow rate; and when the overall temperature prediction value is lower than a preset temperature lower limit, temporarily stopping operating the temperature control device.

8. A temperature control system, comprising:

a temperature control device, configured to generate an air circulation for a first server and a second server;

a first sensor, configured to detect an operation state of the first server, and configured to obtain a first state data;

a second sensor, configured to detect an operation state of the second server, and configured to obtain a second state data; and an analysis device, coupled to the temperature control device, the first sensor and the second sensor, configured to detect an operation state of the temperature control device, and configured to obtain the operation states of the first server and the second server continuously to establish a first learning model, wherein the analysis device is further configured to input a temperature control state data of the temperature control device, a first temperature of the first state data and a second temperature of the second state data into the first learning model to obtain a first temperature prediction value output by the first learning model, and the analysis device is further configured to adjust the temperature control device according to the first temperature prediction value;

wherein the first server is adjacent to the second server, and the first state data further comprises a first distance between the first server and the temperature control device.

9. The temperature control system of claim 8, wherein the analysis device is configured to detect a cold air temperature or a cold air flow rate of the temperature control device in a detection period, and obtain a plurality of operating temperatures at which the first server and the second server operate in the detection period.

10. The temperature control system of claim 8, wherein the temperature control device is configured to generate a cold air for a cold air channel near a rack.

11. The temperature control system of claim 8, wherein the analysis device is further configured to detect the operation states of the temperature control device, the first server and the second server continuously to establish a second learning model, and the analysis device is further configured to input the temperature control state data, the first state data and the second state data into the second learning model to obtain a second temperature prediction value output by the second learning model.

12. The temperature control system of claim 11, wherein the analysis device is further configured to calculate an overall temperature prediction value of a rack according to the first temperature prediction value and the second temperature prediction value, and adjust a cold air temperature or a cold air flow rate of the temperature control device according to the overall temperature prediction value.

13. The temperature control system of claim 12, wherein when the overall temperature prediction value is higher than a preset temperature upper limit, the analysis device is configured to control the temperature control device to reduce the cold air temperature or increase the cold air flow rate; and when the overall temperature prediction value is lower than a preset temperature lower limit, the analysis device is configured to control the temperature control device to stop operating the temperature control device temporarily.

* * * * *